US010620273B2

(12) United States Patent
Tang et al.

(10) Patent No.: US 10,620,273 B2
(45) Date of Patent: Apr. 14, 2020

(54) METHOD AND APPARATUS FOR ESTIMATING A STATE OF HEALTH OF A BATTERY PACK AND COMPUTER-READABLE MEDIUM

(71) Applicant: Contemporary Amperex Technology Co., Limited, Ningde, Fujian (CN)

(72) Inventors: Shenzhi Tang, Ningde (CN); Yanhua Lu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 63 days.

(21) Appl. No.: 15/992,371

(22) Filed: May 30, 2018

(65) Prior Publication Data

US 2018/0348304 A1  Dec. 6, 2018

(30) Foreign Application Priority Data

May 31, 2017 (CN) .......................... 2017 1 0398410

(51) Int. Cl.
*G01R 31/392* (2019.01)
*G01R 31/382* (2019.01)
(Continued)

(52) U.S. Cl.
CPC ....... *G01R 31/382* (2019.01); *G01R 31/3646* (2019.01); *G01R 31/3648* (2013.01);
(Continued)

(58) Field of Classification Search
CPC ................ G01R 31/392; G01R 31/385; G01R 31/3646; G01R 31/3648
(Continued)

(56) References Cited

U.S. PATENT DOCUMENTS 8,918,299 B2 * 12/2014 Plett ...................... H01M 10/48
702/63
9,244,132 B2 * 1/2016 Bond ................... G01R 31/392
(Continued)

FOREIGN PATENT DOCUMENTS

CN  104360285 A  2/2015
CN  103823188 B  6/2016
(Continued)

OTHER PUBLICATIONS

Office Action and first search report dated Mar. 11, 2019 for Chinese Application No. 201710398410.X, 7 pages.
(Continued)

*Primary Examiner* — Patrick Assouad
*Assistant Examiner* — Demetrius R Pretlow
(74) *Attorney, Agent, or Firm* — Law Offices of Liaoteng Wang

(57) ABSTRACT

A method and apparatus for estimating a state of health of a battery pack and a computer-readable medium are provided, the method including: detecting changes of health indicators of every battery unit in the battery pack, determining whether the battery unit has a correction opportunity for a state of charge thereof during a predetermined period of time based on the detected changes of the health indicators, calculating corrected states of charge and one or more of cumulative changes in capacity between every two correction opportunities of a battery unit having two or more correction opportunities, obtaining a first estimated state of health of the battery unit having two or more correction opportunities based on the above data and estimating the state of health of the battery pack based on the first estimated state of health of the battery unit having two or more correction opportunities.

13 Claims, 4 Drawing Sheets

(51) Int. Cl.
  *G01R 31/385* (2019.01)
  *G01R 31/36* (2020.01)
  *G01R 31/396* (2019.01)

(52) U.S. Cl.
  CPC ......... *G01R 31/385* (2019.01); *G01R 31/392* (2019.01); *G01R 31/396* (2019.01)

(58) Field of Classification Search
  USPC .............................. 320/132; 702/63; 324/426
  See application file for complete search history.

(56) References Cited

U.S. PATENT DOCUMENTS

| | | | | |
|---|---|---|---|---|
| 2004/0178770 | A1* | 9/2004 | Gagnon | H02J 7/0047 320/132 |
| 2009/0027056 | A1* | 1/2009 | Huang | B60L 58/12 324/439 |
| 2009/0184692 | A1* | 7/2009 | Owens, Jr. | H02J 7/14 322/23 |
| 2010/0250162 | A1* | 9/2010 | White | G01R 31/392 702/63 |
| 2012/0011706 | A1 | 1/2012 | Murase et al. | |
| 2012/0041698 | A1* | 2/2012 | Zhang | G01R 31/367 702/63 |
| 2012/0081075 | A1 | 4/2012 | Skelton | |
| 2012/0208672 | A1* | 8/2012 | Sujan | B60W 10/02 477/5 |
| 2013/0027047 | A1* | 1/2013 | Yoshioka | G01R 31/389 324/426 |
| 2013/0066573 | A1* | 3/2013 | Bond | G01R 31/392 702/63 |
| 2014/0287278 | A1* | 9/2014 | Despesse | H01M 2/1072 429/7 |
| 2015/0260795 | A1* | 9/2015 | Vinit | G01R 31/3828 324/426 |
| 2015/0293183 | A1* | 10/2015 | Tenmyo | H01M 10/48 324/429 |
| 2015/0323610 | A1 | 11/2015 | Ahn et al. | |
| 2016/0336623 | A1* | 11/2016 | Nayar | H01M 4/38 |
| 2017/0108553 | A1 | 4/2017 | Ganesan et al. | |
| 2017/0299660 | A1* | 10/2017 | Saint-Marcoux | B60L 58/15 |
| 2018/0050601 | A1* | 2/2018 | Katanoda | B60L 11/1861 |
| 2018/0095141 | A1* | 4/2018 | Wild | G01C 21/3407 |
| 2018/0123185 | A1* | 5/2018 | Kim | G01N 25/00 |
| 2018/0292465 | A1* | 10/2018 | Osara | G01M 5/0033 |

FOREIGN PATENT DOCUMENTS

| | | |
|---|---|---|
| CN | 105866698 A | 8/2016 |
| CN | 106291378 A | 1/2017 |
| CN | 106501726 A | 3/2017 |
| CN | 106597289 A | 4/2017 |
| CN | 106597295 A | 4/2017 |
| CN | 106610475 A | 5/2017 |
| JP | 2000-223164 A | 8/2000 |

OTHER PUBLICATIONS

The extended European search report dated Nov. 14, 2018 for European application No. 18175241.1, 10 pages.

\* cited by examiner

METHOD AND APPARATUS FOR ESTIMATING A STATE OF HEALTH OF A BATTERY PACK AND COMPUTER-READABLE MEDIUM

CROSS-REFERENCE TO RELATED APPLICATION

This application claims priority to Chinese Patent Application No. 201710398410.X, filed on May 31, 2017, which is hereby incorporated by reference in its entirety for all purposes.

TECHNICAL FIELD

The present disclosure generally relates to a technical field of battery pack, and more particularly, to a method and apparatus for estimating a state of health of a battery pack and a computer-readable medium.

BACKGROUND

As aging or degradation will incur in a battery pack after the battery pack has been used for a long period of time, it is necessary to estimate a state of health (SOH) of the battery pack. Usually, the state of health of the battery pack, which is estimated based on a cumulative change in capacity of the battery pack, is represented as SOHC. Prior methods for estimating the SOHC of the battery pack have the following disadvantages:

In an aspect, during normal use of an electrical system, for example, an electric vehicle powered by the battery pack, the electrical system does not have an opportunity to accurately calculate the SOHC of the battery pack.

In another aspect, states of charge (SOCs) of different batter units in the battery pack are inconsistent with each other, and it is difficult to calculate the SOC of a specific battery unit.

In yet another aspect, aging processes of respective battery units in the battery pack are inconsistent with each other, so the SOHC of a whole of the battery pack cannot reflect actual aging states of respective battery units.

For the above reasons, the prior methods for estimating the SOHC of the battery pack cannot obtain an accurate SOHC of the battery pack.

SUMMARY

Embodiments of the present disclosure provide a method and apparatus for estimating a state of health of a battery pack, which may accurately estimate the state of health of the battery pack.

In a first aspect, there is provided a method for estimating a state of health of a battery pack, comprising: detecting changes of health indicators of every battery unit in the battery pack during charging or discharging processes, wherein the health indicators comprise a voltage between two terminals of the battery unit, a charging current of the battery unit, a discharging current of the battery unit and a temperature of the battery unit; determining whether the battery unit has a correction opportunity for a state of charge thereof during a predetermined period of time for estimating the state of health of the battery pack based on the detected changes of the health indicators; calculating corrected states of charge of a battery unit having two or more correction opportunities and one or more of cumulative changes in capacity between every two correction opportunities of the battery unit having two or more correction opportunities; obtaining a first estimated state of health of the battery unit having two or more correction opportunities based on any of the cumulative changes in capacity between every two correction opportunities and the corrected states of charge at the correction opportunities corresponding to the cumulative change in capacity, and estimating the state of health of the battery pack based on the first estimated state of health of the battery unit having two or more correction opportunities.

In a second aspect, there is provided an apparatus for estimating a state of health of a battery pack, comprising: a memory storing computer executable instructions; and a processor, when executing the computer executable instructions stored in the memory, operable for: detecting changes of health indicators of every battery unit in the battery pack during charging or discharging processes, wherein the health indicators comprise a voltage between two terminals of the battery unit, a charging current of the battery unit, a discharging current of the battery unit and a temperature of the battery unit; determining whether the battery unit has a correction opportunity for a state of charge thereof during a predetermined period of time for estimating the state of health of the battery pack based on the detected changes of the health indicators; calculating corrected states of charge of a battery unit having two or more correction opportunities and one or more of cumulative changes in capacity between every two correction opportunities of the battery unit having two or more correction opportunities; obtaining a first estimated state of health of the battery unit having two or more correction opportunities based on any of the cumulative changes in capacity between every two correction opportunities and the corrected states of charge at the correction opportunities corresponding to the cumulative change in capacity, and estimating the state of health of the battery pack based on the first estimated state of health of the battery unit having two or more correction opportunities.

In a third aspect, there is provided a computer-readable medium storing computer executable instructions, the computer executable instructions when executed by a processor enabling the processor to implement the above method for estimating a state of health of a battery pack.

In the method and apparatus for estimating a state of health of a battery pack in accordance with embodiments of the present disclosure, it is determined whether the battery unit has the correction opportunity for the state of charge thereof during the predetermined period of time for estimating the state of health of the battery pack; when the battery unit has two or more correction opportunities during the predetermined period of time, the state of health of the battery unit is estimated based on the cumulative change in capacity between the correction opportunities and the corrected states of charge at the correction opportunities, so that the state of health of the battery pack may be accurately obtained.

BRIEF DESCRIPTION OF THE DRAWINGS

In order to illustrate technical solutions of the embodiments of the disclosure more clearly, accompany drawings that are used to illustrate the embodiments of the disclosure are described in brief below. Obviously, the described accompany drawings are merely some embodiments of the disclosure, and the ordinary skilled in the art will obtain other drawings from theses accompany drawings without creative works.

DETAILED DESCRIPTION

Figure 1:
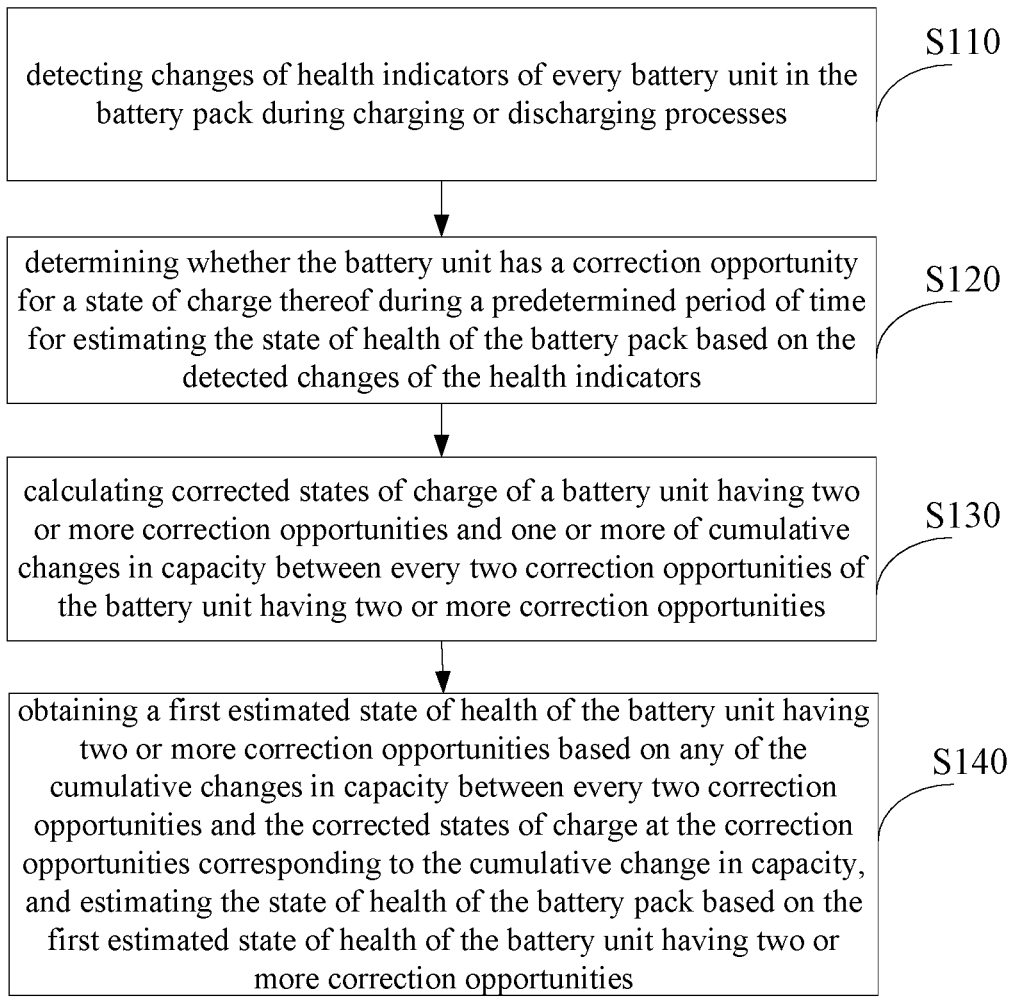
FIG. 1 is a flow diagram illustrating a method for estimating a state of health of a battery pack in accordance with an embodiment of the disclosure.

Features and exemplary embodiments of various aspects of the disclosure will be described in detail below. In the following detailed description, many specific details are provided in order to provide thorough understanding of the disclosure. However, it is apparent for the ordinary skilled in the art that the disclosure may be practiced without some of the specific details. The following description of embodiments is merely intended to provide better understanding of the disclosure by illustrating examples of the disclosure. The disclosure is not limited to specific configurations and algorithms provided below, and may cover any modifications, alternatives and improvements of elements, components and algorithms without departing from the spirit of the disclosure. In the accompany drawings and the following description, well known structures and techniques are not illustrated so as to avoid unnecessary obscuring the disclosure.

It should be noted that embodiments of the disclosure and features in the embodiments may be combined with each other. The disclosure will be described in detail below in conjunction with the embodiments by referring to the accompany drawings.

Some methods for estimating a state of health of a battery pack attempt to estimate an internal resistance and a capacity of the battery pack based on an extended Kalman filtering algorithm of a state space mode of the battery pack to estimate a SOHC of the batter pack, but there are some disadvantages such as large error and low feasibility and so on. Other methods for estimating a state of health of a battery pack estimate a current actual capacity of the battery pack by utilizing statistics of cumulative charging and discharging capacities provided by a batter pack management system, wherein the methods entirely rely on offline calibration data and thus cannot reflect an actual situation of the battery pack. Once the capacity of the battery pack reduces significantly due to environmental deterioration or quality problems, estimation results of the above methods for estimating a state of health of a batter pack will substantially deviate from the actual state of health of the batter pack.

In some examples, the state of health of a whole of the battery pack may be estimated online by the following processing: charging the battery pack having the battery pack management system on a charging and discharging machine, and calculating the state of health of the battery pack during a period of time from the battery pack starting to be charged to the batter pack being fully charged. As there exist inconsistencies between battery units in the battery pack, for example, there inevitably exist differences between SOCs of the battery units in the battery pack, the battery pack being fully charged actually means a battery unit whose SOC is the highest being fully charged. As the SOH of the battery pack is calculated based on a minimum SOC corresponding to a lowest voltage when the battery pack is not charged, the estimation result of the above method for estimating a state of health of a battery pack usually is lower than the actual state of health of the battery pack.

In view of the above problems, embodiments of the disclosure provide a method for estimating a state of health of a battery pack. FIG. 1 is a flow diagram illustrating a method for estimating a state of health of a battery pack in accordance with an embodiment of the disclosure, the method including steps S110-S140.

In S110, changes of health indicators of every battery unit in the battery pack are detected during charging or discharging processes, wherein the health indicators include a voltage between two terminals of the battery unit, a charging current of the battery unit, a discharging current of the battery unit and a temperature of the battery unit.

In some embodiments, in S110, the battery unit may be a battery cell or a module composed of battery cells. In some examples, the detected health indicators of the battery pack may be the health indicators of the battery units in the battery pack in either the charging processes or the discharging processes.

In S120, it is determined whether the battery unit has a correction opportunity for a state of charge thereof during a predetermined period of time for evaluating the state of health of the battery pack based on the detected changes of the health indicators.

In some examples, in S120, the predetermined period of time may be a plurality types of periods, for example, standard time units such as months, years and so on, various time ranges such as 300 days, 3 months and so on composed of standard time units.

In some examples, in S120, the correction opportunity for the battery unit may be when the battery unit is sat quietly for a long period of time, when the battery unit is pseudo-static, or when the battery unit is fully charged.

In S130, corrected states of charge of a battery unit having two or more correction opportunities and one or more of cumulative changes in capacity between every two correction opportunities of the battery unit having two or more correction opportunities are calculated.

In some examples, in S130, the battery unit may have multiple correction opportunities for the state of charge thereof during the predetermined period of time. For example, if there are four correction opportunities for the state of charge of the battery unit, then $C_4^2$ cumulative changes in capacity of the battery unit may be calculated.

In some examples, the battery unit having two or more correction opportunities may be selected as a first battery unit, and the corrected states of charge at two of the correction opportunities of the first battery unit and the cumulative change in capacity between the two correction opportunities of the first battery unit may be calculated. It is necessary to obtain only one cumulative change in capacity of the battery unit when estimating the state of health of the battery unit in the battery pack, so any of the above plurality of cumulative changes in capacity may be selected. That is, the state of health of the battery unit may be calculated based on the cumulative change in capacity between any two correction opportunities of the battery unit.

In some examples, if the battery unit is charged and discharged multiple times between the two correction opportunities, then the cumulative change in capacity between the two correction opportunities of the battery unit is a cumulative sum of charging capacities minus a cumulative sum of discharging capacities of the battery unit.

In S140, a first estimated state of health of the battery unit having two or more correction opportunities is obtained based on any of the cumulative changes in capacity between every two correction opportunities and the corrected states of charge at the correction opportunities corresponding to the cumulative change in capacity, and the state of health of the battery pack is estimated based on the first estimated state of health of the battery unit having two or more correction opportunities.

In some examples, in S140, the battery unit having two or more correction opportunities may be selected as the first battery unit, and the corrected states of charge at any two of the correction opportunities of the first battery unit and the cumulative change in capacity between the two correction opportunities of the first battery unit may be calculated.

In some examples, the SOHC of the battery unit such as the battery pack or the module composed of battery cells may be estimated as required.

In some examples, an average value of the first estimated states of health of the battery unit may be calculated to obtain an average SOHC for use by the battery pack management system or another module. In some examples, a minimum first estimated state of health may be selected from the first estimated states of health as a minimum SOHC of the battery pack.

In some examples, if a difference between the corrected states of charge at the two correction opportunities is too small, it will influence the accuracy of the estimated state of health of the battery pack. So before S140, the method may further include a step of determining whether the difference between the corrected states of charge at the two correction opportunities is larger than a predetermined value, and S140 is performed when the difference between the corrected states of charge at the two correction opportunities is larger than the predetermined value.

In the method for estimating a state of health of a battery pack in accordance with an embodiment of the invention, it is determined whether the battery unit has the correction opportunity for the state of charge thereof during the predetermined period of time for estimating the state of health of the battery pack, and the state of health of the battery unit is estimated based on the cumulative change in capacity between the correction opportunities and the corrected states of charge at the correction opportunities, so that the state of health of the battery pack may be accurately obtained.

In some examples, S140 includes the following expression:

$$SOHC(n) = \Delta Capacity(n) / \{SOC(n) \times BOL\ Capacity(n)\} \quad (1)$$

In the expression (1), SOHC (n) is the first estimated state of health of a battery unit "n", ΔCapacity (n) is one of the cumulative changes in capacity between every two correction opportunities of the battery unit "n", SOC (n) is the corrected state of charge at one of the correction opportunities corresponding to the cumulative change in capacity of the battery unit "n", and BOL Capacity (n) is a preset initial cumulative change in capacity of the battery unit "n".

Figure 2:
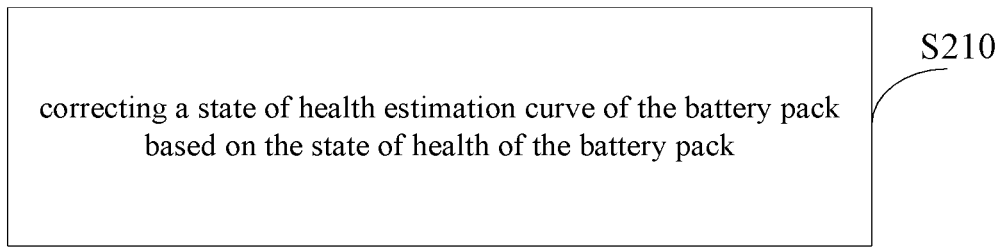
FIG. 2 is a flow diagram illustrating a method for estimating a state of health of a battery pack in accordance with another embodiment of the disclosure.

FIG. 2 is a flow diagram illustrating a method for estimating a state of health of a battery pack in accordance with another embodiment of the disclosure. As shown in FIG. 2, the method for estimating a state of health of a battery pack may further include a step S210, in which a state of health estimation curve of the battery pack may be corrected based on the state of health of the battery pack estimated by the method for estimating a state of health of a battery pack shown in FIG. 1.

In some examples, a function of an initial state of health estimation curve may be derived by the following expression:

$$\frac{dQ}{dt} = -A \times Q^3 \times e^{\left(-\frac{E + K \times C_{Rate}^{0.2}}{R \times T}\right)}$$

wherein $C_{Rate}$ is a cumulative cyclic capacity of the battery unit, Q is SOH*BOL capacity of the battery unit, i.e. a current remaining capacity of the battery unit that may represent the SOHC of the battery unit, "E", "A" and "K" are battery cell related parameters, "T" is the temperature of the battery unit, "t" is a duration in which the battery unit is used, and "R" is a constant.

The following expression may be derived from the above expression:

$$SOHC = Q = \frac{1}{\sqrt{2A \times e^{\left(-\frac{E + K \times C_{Rate}^{0.2}}{R \times T}\right)} \times t + c_0}}$$

Wherein "$c_0$" may be considered as a constant.

In some examples, S210 may be performed after S140 in FIG. 1.

In some examples, S210 may include: obtaining a correction factor "a" based on an average value $SOHC_{k\text{-}Average}$ of the first estimated states of health of the battery unit that is calculated at the $k^{th}$ time and the state of health $SOHC_{k-1}$ of the battery pack that is calculated based on the state of health estimation curve being corrected for (k−1) times of the battery pack; correcting the state of health estimation curve being corrected for (k−1) times of the battery pack by the correction factor "a", wherein the correction factor "a" may be calculated by the following expression:

$$a = SOHC_{k\text{-}Average} \div SOHC_{k-1} \quad (2)$$

In the expression (2), k is an integer larger than zero.

In some examples, the processing of correcting the function of the initial state of health estimation curve may include: if the function of the initial state of health estimation curve without correction may be represented as $$SOHC = \frac{1}{\sqrt{2A \times e^{\left(-\frac{E + K \times C_{Rate}^{0.2}}{R \times T}\right)} \times t + c_0}}$$

then the function of the corrected state of health estimation curve that is corrected once may be represented as $$SOHC_1 = \cfrac{a}{\sqrt{2A \times e^{\left(-\frac{E+K \times C_{Rate}^{0.2}}{R \times T}\right)} \times t + c_0}}$$

Figure 3:
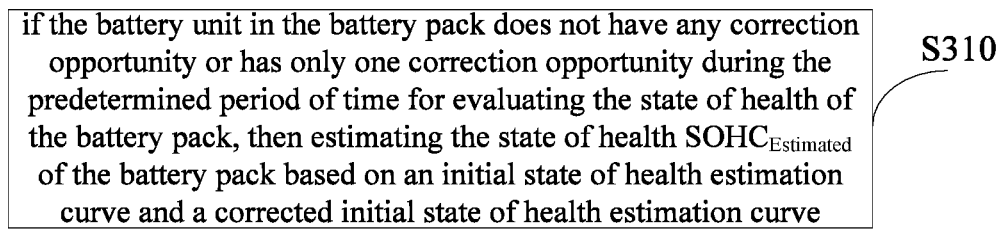
FIG. 3 is a flow diagram illustrating a method for estimating a state of health of a battery pack in accordance with yet another embodiment of the disclosure.

FIG. 3 is a flow diagram illustrating a method for estimating a state of health of a battery pack in accordance with yet another embodiment of the disclosure. As shown in FIG. 3, the method for estimating a state of health of a battery pack may further include a step S310, in which if the battery unit in the battery pack does not have any correction opportunity or has only one correction opportunity, then the state of health $SOHC_{Estimated}$ of the battery pack may be estimated based on the initial state of health estimation curve and the corrected initial state of health estimation curve, wherein:

$$SOHC_{Estimated} = SOHC_{p\ (m-1)} - SOHC \text{ attenuation value} \quad (3)$$

$$SOHC \text{ attenuation value} = SOHC_{m-1} - \quad (4)$$

In the expressions (3) and (4), $SOHC_m$ may be obtained based on $x_m$ and the function of the state of health estimation curve that is corrected for the last time before a $m^{th}$ predetermined period of time, and $x_m$ is operating condition data from a start time of estimating the state of health of the battery pack to the end of the $m^{th}$ predetermined period of time.

If the battery unit in the battery pack does not have any correction opportunity or has only one correction opportunity during a $(m-1)^{th}$ predetermined period of time, $SOHC_{m-1}$ may be obtained based on $x_{m-1}$ and the function of the state of health estimation curve that is corrected for the last time before the $m^{th}$ predetermined period of time, and $x_{m-1}$ is the operating condition data from the start time of estimating the state of health of the battery pack to the end of the $(m-1)^{th}$ predetermined period of time.

$SOHC_{p(m-1)}$ may be obtained based on $SOHC_{p(m-1)}$, $SOHC_{m-1}$ and $SOHC_{m-2}$.

$SOHC_{p(m-2)}$ may be obtained during a $(m-2)^{th}$ period of time. And so on, $SOHC_{p(m)}$ of another predetermined period of time may be solved according to a principle similar to that used to solve $SOHC_{p(m-1)}$.

$SOHC_{m-2}$ may be obtained based on $x_{m-2}$ and the function of the state of health estimation curve that is corrected for the last time before the $(m-1)^{th}$ predetermined period of time, and $x_{m-2}$ is the operating condition data from the start time of estimating the state of health of the battery pack to the end of the $(m-2)^{th}$ predetermined period of time, wherein m is an integer larger than 1, and $SOHC_{P(m-2)}$ is 1 when m is 2.

In some examples, the operating condition data of the battery pack may be the number of cycles of discharging and recharging of the battery pack every day or the number of days when the battery pack is used.

In some examples, in the $(m-1)^{th}$ predetermined period of time, if the battery unit in the battery pack has two or more correction opportunities, then $SOHC_{m-1}$ may be obtained based on the first estimated state of health calculated in the $(m-1)^{th}$ predetermined period of time, and $SOHC_{p(m-1)}$ may be the state of health of the battery pack that is obtained based on the first estimated state of health, wherein m is an integer larger than 1.

Therefore, the method for estimating a state of health of a battery pack may estimate the state of health of the battery pack, in which the battery unit does not have any correction opportunity or has only one correction opportunity during the predetermined period of time for estimating the state of health of the battery pack, and thus obtain an accurate $SOHC_{Evaluated}$.

The method for estimating a state of health of a battery pack in accordance with embodiments of the disclosure is described above in conjunction with FIGS. 1-3, and an apparatus for estimating a state of health of a battery pack in accordance with embodiments of the disclosure will be described below in conjunction with FIGS. 4-6.

Figure 4:
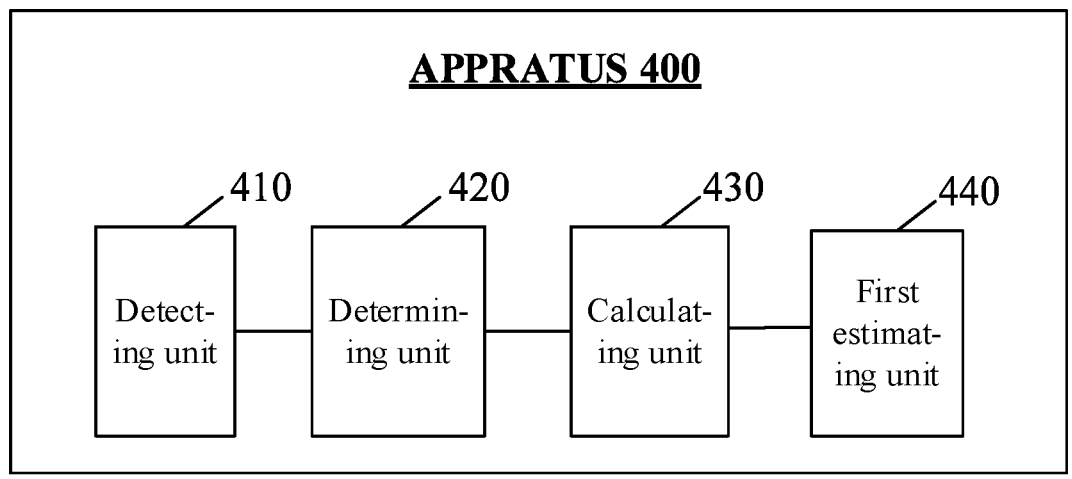
FIG. 4 is a structure diagram illustrating an apparatus for estimating a state of health of a battery pack in accordance with an embodiment of the disclosure.

FIG. 4 is a structure diagram illustrating an apparatus for estimating a state of health of a battery pack in accordance with an embodiment of the disclosure. As shown in FIG. 4, the apparatus 400 for estimating a state of health of a battery pack may include a detecting unit 410, a determining unit 420, a calculating unit 430 and a first estimating unit 440.

The detecting unit 410 may be operable for detecting changes of health indicators of every battery unit in the battery pack during charging or discharging processes, wherein the health indicators include a voltage between two terminals of the battery unit, a charging current of the battery unit, a discharging current of the battery unit and a temperature of the battery unit.

The determining unit 420 may be operable for determining whether the battery unit has a correction opportunity for a state of charge thereof during a predetermined period of time for estimating the state of health of the battery pack based on the detected changes of the health indicators.

The calculating unit 430 may be operable for calculating corrected states of charge of a battery unit having two or more correction opportunities and one or more of cumulative changes in capacity between every two correction opportunities of the battery unit having two or more correction opportunities.

The first evaluating unit 440 may be operable for obtaining a first estimated state of health of the battery unit having two or more correction opportunities based on any of the cumulative changes in capacity between every two correction opportunities and the corrected states of charge at the correction opportunities corresponding to the cumulative change in capacity and estimate the state of health of the battery pack based on the first estimated state of health of the battery unit having two or more correction opportunities.

The apparatus 400 for estimating a state of health of a battery pack in accordance with embodiments of the disclosure is an entity for implementing the method for estimating a state of health of a battery pack in accordance with embodiments of the disclosure, and the above operations and/or functions of respective units in the apparatus 400 for estimating a state of health of a battery pack correspond to the steps in the method shown in FIG. 1, respectively, so they are not redundantly described herein for clarity.

In the apparatus for estimating a state of health of a battery pack in accordance with embodiments of the disclosure, it is determined whether the battery unit has the correction opportunity for the state of charge thereof during the predetermined period of time for estimating the state of health of the battery pack; when the battery unit has two or more correction opportunities during the predetermined period of time, the state of health of the battery unit is estimated based on the cumulative change in capacity between the correction opportunities and the corrected states of charge at the correction opportunities, so that the state of health of the battery pack may be accurately obtained.

In some examples, the calculating unit 430 may be further operable for selecting the battery unit having two or more correction opportunities as a first battery unit and calculating the corrected states of charge at any two of the correction opportunities of the first battery unit and the cumulative change in capacity between the two correction opportunities of the first battery unit.

In some examples, the first estimating unit 440 may be further operable for, when a difference between the corrected states of charge at the two correction opportunities is larger than a predetermined value, obtaining a first estimated state of health of the battery unit based on any of the cumulative changes in capacity between every two correction opportunities and the corrected states of charge at the correction opportunities corresponding to the cumulative change in capacity, and estimating the state of health of the battery pack based on the first estimated state of health of the battery unit.

In some examples, the first estimated state of heath may be obtained by the expression (1).

Figure 5:
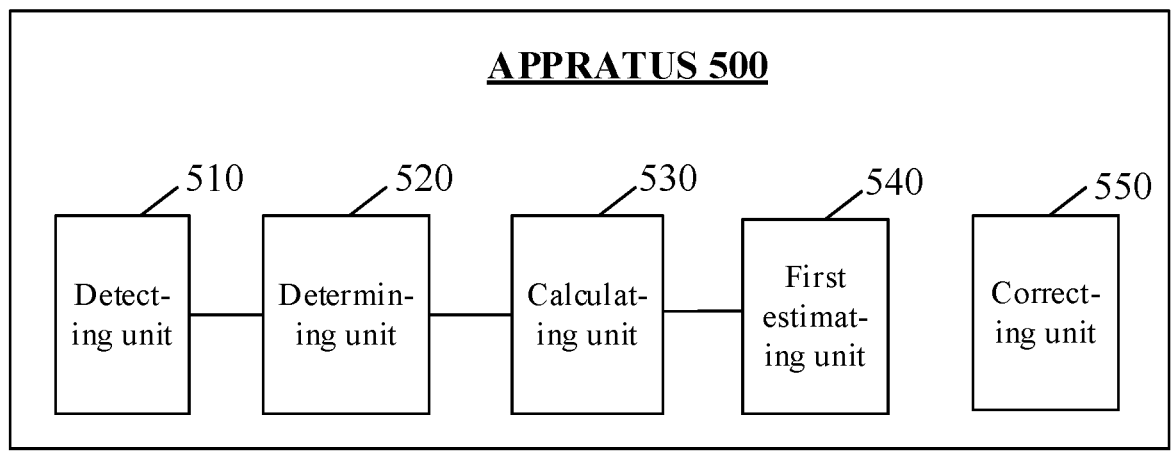
FIG. 5 is a structure diagram illustrating an apparatus for estimating a state of health of a battery pack in accordance with another embodiment of the disclosure.

FIG. 5 is a structure diagram illustrating an apparatus for estimating a state of health of a battery pack in accordance with another embodiment of the disclosure. As shown in FIG. 5, the apparatus 500 for estimating a state of health of a battery pack may further include a correcting unit 550 operable for correcting a state of health estimation curve of the battery pack based on the state of health of the battery pack.

In some examples, the correcting unit 550 may be operable for obtaining a correction factor "a" based on an average value $SOHC_{k\text{-}Average}$ of the first estimated states of health, which is calculated at the $k^{th}$ time, of the battery unit and the state of health $SOHC_{k-1}$, which is calculated based on the state of health estimation curve being corrected for (k−1) times of the battery pack, of the battery pack; correcting the state of health estimation curve being corrected for (k−1) times of the battery pack by the correction factor "a", wherein the correction factor "a" may be calculated by the following expression:

$$a = SOHC_{kAverage} \div SOHC_{k-1}$$

wherein k is an integer larger than zero.

Figure 6:
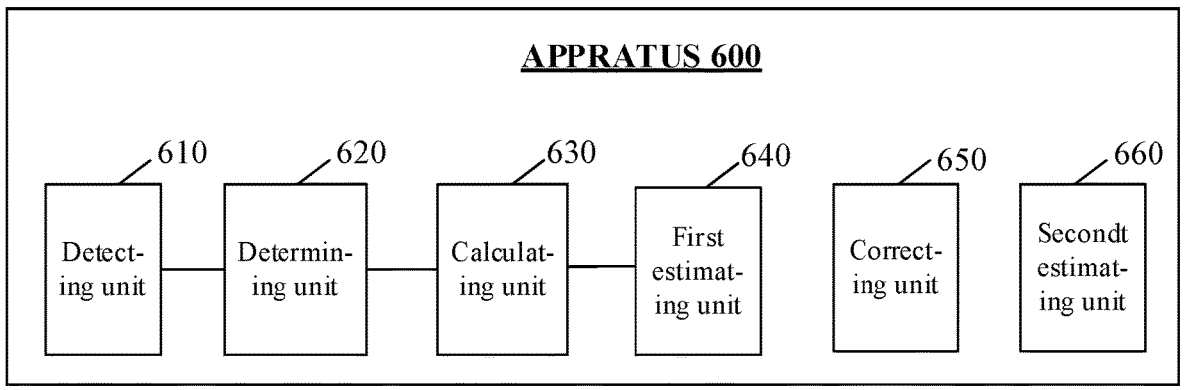
FIG. 6 is a structure diagram illustrating an apparatus for estimating a state of health of a battery pack in accordance with yet another embodiment of the disclosure.

FIG. 6 is a structure diagram illustrating an apparatus for estimating a state of health of a battery pack in accordance with yet another embodiment of the disclosure. As shown in FIG. 6, the apparatus 600 for estimating a state of health of a battery pack may further include a second estimating unit 660 operable for, if the battery unit in the battery pack does not have any correction opportunity or has only one correction opportunity, then estimating the state of health $SOHC_{Estimated}$ of the battery pack based on the initial state of health estimation curve and the corrected initial state of health estimation curve, wherein:

$SOHC_{Estimated}$ may be obtained by the expressions (3) and (4).

$SOHC_m$ may be obtained based on $x_m$ and the function of the state of health estimation curve that is corrected for the last time before a $m^{th}$ predetermined period of time, and $x_m$ is operating condition data from a start time of estimating the state of health of the battery pack to the end of the $m^{th}$ predetermined period of time.

If the battery unit in the battery pack does not have any correction opportunity or has only one correction opportunity during a $(m-1)^{th}$ predetermined period of time, $SOHC_{m-1}$ may be obtained based on $x_{m-1}$ and the function of the state of health estimation curve that is corrected for the last time before the $m^{th}$ predetermined period of time, and $x_{m-1}$ is the operating condition data from the start time of estimating the state of health of the battery pack to the end of the $(m-1)^{th}$ predetermined period of time.

$SOHC_{p(m-1)}$ may be obtained based on $SOHC_{p(m-1)}$, $SOHC_{m-1}$ and $SOHC_{m-2}$.

$SOHC_{p(m-2)}$ may be obtained during a $(m-2)^{th}$ period of time. And so on, $SOHC_{p(m)}$ of another predetermined period of time may be solved according to a principle similar to that used to solve $SOHC_{p(m-1)}$.

$SOHC_{m-2}$ may be obtained based on $x_{m-2}$ and the function of the state of health estimation curve that is corrected for the last time before the $(m-1)^{th}$ predetermined period of time, and $x_{m-2}$ is the operating condition data from the start time of estimating the state of health of the battery pack to the end of the $(m-2)^{th}$ predetermined period of time, wherein m is an integer larger than 1, and $SOHC_{P(m-2)}$ is 1 when m is 2.

In some examples, the operating condition data of the battery pack may be the number of cycles of discharging and recharging of the battery pack every day or the number of days when the battery pack is used.

In some examples, in the $(m-1)^{th}$ predetermined period of time, if the battery unit in the battery pack has two or more correction opportunities, then $SOHC_{m-1}$ may be obtained based on the first estimated state of health calculated in the $(m-1)^{th}$ predetermined period of time, and $SOHC_{p(m-1)}$ may be the state of health of the battery pack that is obtained based on the first estimated state of health, wherein m is an integer larger than 1.

Therefore, the method for estimating a state of health of a battery pack may estimate the state of health of the battery pack, in which the battery unit does not have any correction opportunity or has only one correction opportunity during the predetermined period of time for estimating the state of health of the battery pack, and thus obtain an accurate $SOHC_{Evaluated}$.

Figure 7:
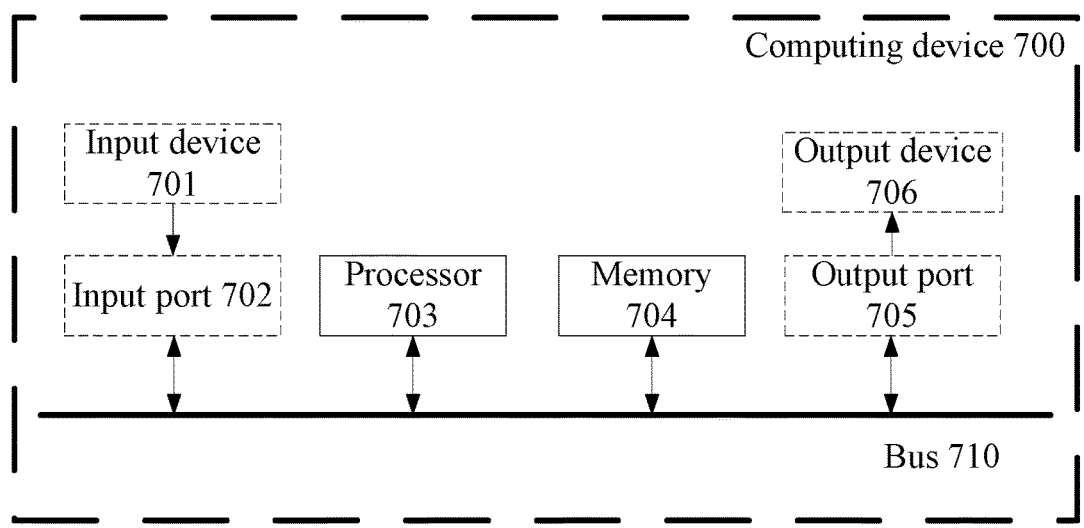
FIG. 7 is a structure diagram illustrating a computing device implementing the methods for estimating a state of health of a battery pack in accordance with embodiments of the disclosure.

FIG. 7 is a structure diagram illustrating a computing device implementing the methods for estimating a state of health of a battery pack in accordance with embodiments of the disclosure. At least a part of the above described methods and apparatuses for estimating a state of health of a battery pack may be implemented by a computing device 700 including an input device 701, an input port 702, a processor 703, a memory 704, an output port 705 and an output device 706. The input port 702, the processor 703, the memory 704 and the output port 705 are connected with each other via a bus 710, and the input device 701 and the output device 706 are connected to the bus via the input port 702 and the output port 705 respectively and thus are connected to other components. It should be noted that the input port and the output port may be I/O interfaces. Specifically, the input device 701 receives input information from external and transmits the input information to the processor 703 via the input port 702; the processor 703 processes the input information based on computer executable instructions stored in the memory 704 to generate output information, temporarily or persistently stores the output information in the memory 704, and then transmits the output information to the output device 706 via the output port 705; the output device 706 outputs the output information to external of the computing device 700.

When the apparatus for estimating a state of health of a battery pack shown in FIG. 4 is embodied by the computing device 700 shown in FIG. 7, the input device 701 receives the changes of the health indicators of every battery unit in the battery pack during the charging or discharging processes, wherein the health indicators include the voltage between the two terminals of the battery unit, the charging current of the battery unit, the discharging current of the battery unit and the temperature of the battery unit. In some specific embodiments, the I/O interface connected to the output device may include hardware, software or a combination thereof, and provide one or more interfaces for communication between the computing device 700 and one or more I/O devices. If appropriate, the computing device 700 may include one or more I/O devices, which allow communication between human being and the computing device 700. For example, the I/O devices may include a keyboard, a keypad, a microphone, a monitor, a mouse, a printer, a scanner, a speaker, a still camera, a stylus, a handwriting board, a touch screen, a track ball, a video camera, another appropriate I/O device or any combination of two or more of them. The I/O devices may include one or more sensors. If appropriate, the I/O interface may include one or more devices or a software driver allowing the processor 703 to drive one or more of the I/O devices. If appropriate, the I/O interface may include one or more I/O interfaces. Although the embodiments of the disclosure illustrate specific I/O interfaces, the embodiments of the disclosure may employ any appropriate I/O interface. Based on the computer executable instructions stored in the memory 704, the processor 703 determines whether the battery unit has the correction opportunity for the state of charge thereof during the predetermined period of time for estimating the state of health of the battery pack based on the detected changes of the health indicators, calculates the corrected states of charge of the battery unit having two or more correction opportunities and one or more of the cumulative changes in capacity between every two correction opportunities of the battery unit having two or more correction opportunities, obtains the first estimated state of health of the battery unit having two or more correction opportunities based on any of the cumulative changes in capacity between every two correction opportunities and the corrected states of health at the correction opportunities corresponding to the cumulative change in capacity, and estimates the state of health of the battery pack based on the first estimated state of health of the battery unit having two or more correction opportunities. Then, the first estimated state of health may be output via the output port 705 and the output device 706 if required.

The abovementioned units, which are described as separate components, may be or may not be physically separate from each other; the components described as the abovementioned units may be or may not be physical units, and may be located at a same place or distributed across a plurality of network units. Some or all of the described units may be selected to achieve purposes of the embodiments of the disclosure as required.

What is claimed is:

1. A method for estimating a state of health of a battery pack, comprising:
    detecting changes of health indicators of a battery unit in the battery pack during charging or discharging processes, wherein the health indicators comprise a voltage between two terminals of the battery unit, a charging current or a discharging current of the battery unit, and a temperature of the battery unit;
    determining whether the battery unit has a correction opportunity for a state of charge thereof during a predetermined period of time for estimating the state of health of the battery pack based on the detected changes of the health indicators, wherein the correction opportunity for the battery unit is when the battery unit is sat quietly for a long period of time or when the battery unit is fully charged;
    selecting, from the battery pack, a battery unit having two or more correction opportunities as a first battery unit and calculating corrected states of charge at any two of the correction opportunities of the first battery unit and a cumulative change in capacity between the two correction opportunities of the first battery unit; and
    obtaining a first estimated state of health of the first battery unit based on the cumulative change in capacity between the two correction opportunities and the corrected states of charge at the two correction opportunities, and estimating the state of health of the battery pack based on the first estimated state of health of the first battery unit.

2. The method of claim 1, wherein after the obtaining a first estimated state of health of the first battery unit based on the cumulative change in capacity between the two correction opportunities and the corrected states of charge at the two correction opportunities, and estimating the state of health of the battery pack based on the first estimated state of health of the first battery unit, the method further comprises:
    correcting a state of health estimation curve of the battery pack based on the estimated state of health of the battery pack, wherein the state of health estimation curve of the battery pack is represented by a function of $$SOHC = \frac{1}{\sqrt{2A \times e^{\left(-\frac{E+K \times C_{Rate}^{0.2}}{R \times T}\right)} \times t + c_0}},$$

wherein "SOHC" represents the state of health of the battery pack, "E", "A" and "K" are battery cell related parameters, $C_{Rate}$ is a cumulative cyclic capacity of the battery pack, "T" is a temperature of the battery pack, "R" and "c0" are constants, and "t" is a duration in which the battery pack is used.

3. The method of claim 1, wherein before the obtaining a first estimated state of health of the first battery unit based on the cumulative change in capacity between the two correction opportunities and the corrected states of charge at the two correction opportunities, and estimating the state of health of the battery pack based on the first estimated state of health of the first battery unit, the method further comprises:
    determining whether a difference between the corrected states of charge at the two correction opportunities is larger than a predetermined value.

4. The method of claim 3, wherein the obtaining a first estimated state of health of the first battery unit based on the cumulative change in capacity between the two correction opportunities and the corrected states of charge at the two correction opportunities, and estimating the state of health of the battery pack based on the first estimated state of health of the first battery unit comprises:

$$SOHC(n) = \Delta Capacity(n)/\{SOC(n) \times BOL\ Capacity(n)\}$$

wherein SOHC (n) is the first estimated state of health of the first battery unit "n", $\Delta$Capacity (n) is the cumulative change in capacity between the two correction opportunities of the first battery unit "n", SOC (n) is the corrected state of charge at one of the two correction opportunities corresponding to the cumulative change in capacity of the first battery unit "n", and BOL Capacity (n) is a preset initial cumulative change in capacity of the first battery unit "n".

5. The method of claim 2, wherein the correcting a state of health estimation curve of the battery pack based on the estimated state of health of the battery pack comprises:

obtaining a correction factor "a" based on an average value $SOHC_{k\text{-}Average}$ of the first estimated state of health, which is calculated at the $k^{th}$ time, of the battery unit and the state of health $SOHC_{k-1}$, which is calculated based on the state of health estimation curve being corrected (k−1) times of the battery pack, of the battery pack;

correcting the state of health estimation curve being corrected (k−1) times of the battery pack by the correction factor "a", wherein an expression for calculating the correction factor "a" is the following:

$$a = SOHC_{k\text{-}Average} \div SOHC_{k-1}$$

wherein "k" is an integer larger than zero.

6. The method of claim 2, further comprising:

if a battery unit in the battery pack does not have any correction opportunity or has only one correction opportunity during the predetermined period of time for estimating the state of health of the battery pack, then estimating the state of health $SOHC_{Estimated}$ of the battery pack based on an initial state of health estimation curve and a corrected initial state of health estimation curve, wherein $$SOHC_{Estimated} = SOHC_{p\ (m-1)} - SOHC\ \text{attenuation value},$$

$$SOHC\ \text{attenuation value} = SOHC_{m-1} - SOHC_m,$$

$SOHC_m$ is obtained based on $x_m$ and a function of the state of health estimation curve that is corrected for the last time before a $m^{th}$ predetermined period of time, and $x_m$ is operating condition data from a start time of estimating the state of health of the battery pack to the end of the $m^{th}$ predetermined period of time;

if a battery unit in the battery pack does not have any correction opportunity or has only one correction opportunity during a $(m-1)^{th}$ predetermined period of time, $SOHC_{m-1}$ is obtained based on $x_{m-1}$ and the function of the state of health estimation curve that is corrected for the last time before the $m^{th}$ predetermined period of time, and $x_{m-1}$ is the operating condition data from the start time of estimating the state of health of the battery pack to the end of the $(m-1)^{th}$ predetermined period of time;

$SOHC_{P(m-1)}$ is obtained based on $SOHC_{P(m-2)}$, $SOHC_{m-1}$ and $SOHC_{m-2}$, $SOHC_{P(m-2)}$ is obtained during a $(m-2)^{th}$ predetermined period of time, $SOHC_{m-2}$ is obtained based on $x_{m-2}$ and the function of the state of health estimation curve that is corrected for the last time before the $(m-1)^{th}$ predetermined period of time, and $x_{m-2}$ is the operating condition data from the start time of estimating the state of health of the battery pack to the end of the $(m-2)^{th}$ predetermined period of time, wherein m is an integer larger than 1, and $SOHC_{P(m-2)}$ is 1 when m is 2;

if a battery unit in the battery pack has two or more correction opportunities during the $(m-1)^{th}$ predetermined period of time, $SOHC_{m-1}$ is obtained based on the first estimated state of health calculated during the $(m-1)^{th}$ predetermined period of time;

$SOHC_{P(m-1)}$ is the state of health of the battery pack obtained based on the first estimated state of health.

7. An apparatus for estimating a state of health of a battery pack, comprising:

a memory storing computer executable instructions; and a processor, when executing the computer executable instructions stored in the memory, operable for:

detecting changes of health indicators of a battery unit in the battery pack during charging or discharging processes, wherein the health indicators comprise a voltage between two terminals of the battery unit, a charging current or a discharging current of the battery unit, and a temperature of the battery unit;

determining whether the battery unit has a correction opportunity for a state of charge thereof during a predetermined period of time for estimating the state of health of the battery pack based on the detected changes of the health indicators, wherein the correction opportunity for the battery unit is when the battery unit is sat quietly for a song period of time or when the battery unit is fully charged;

selecting a battery unit having two or more correction opportunities as a first battery unit and calculating corrected states of charge at any two of the correction opportunities of the first battery unit and a cumulative change in capacity between the two correction opportunities of the first battery unit; and obtaining a first estimated state of health of the first battery unit based on the cumulative change in capacity between the two correction opportunities and the corrected states of charge at the two correction opportunities, and estimating the state of health of the battery pack based on the first estimated state of health of the first battery unit.

8. The apparatus of claim 7, wherein the processor is further operable for:

correcting a state of health estimation curve of the battery pack based on the estimated state of health of the battery pack, wherein the state of health estimation curve of the battery pack is represented by a function of $$SOHC = \frac{1}{\sqrt{2A \times e^{\left(-\frac{E + K \times C_{Rate}^{0.2}}{R \times T}\right)} \times t + c_0}},$$

where "SOHC" represents the state of health of the battery pack, "E", "A" and "K" are battery cell related parameter, $C_{Rate}$ is a cumulative cyclic capacity of the batter pack, "T" is a temperature of the battery pack, "R" and "c0" are constants, and "t" is a duration in which the battery pack is used.

9. The apparatus of claim 7, wherein the processor is further operable for:

determining whether a difference between the corrected states of charge at two correction opportunities is larger than a predetermined value.

10. The apparatus of claim 9, wherein the first estimated state of health of the first battery unit is obtained by the following expression:

$$SOHC(n) = \Delta Capacity(n) / \{SOC(n) \times BOL\ Capacity(n)\}$$

wherein SOHC (n) is the first estimated state of health of the first battery unit "n", ΔCapacity (n) is the cumulative change in capacity between the two correction opportunities of the battery unit "n", SOC (n) is the corrected state of charge at one of the two correction opportunities corresponding to the cumulative change in capacity of the first battery unit "n", and BOL Capacity (n) is a preset initial cumulative change in capacity of the battery unit "n".

11. The apparatus of claim 8, wherein the processor is further operable for:
obtaining a correction factor "a" based on an average value $SOHC_{k\text{-}Average}$ of the first estimated state of health, which is calculated at the $k^{th}$ time, of the first battery unit and the state of health $SOHC_{k-1}$, which is calculated based on the state of health estimation curve being corrected (k−1) times of the battery pack, of the battery pack;
correcting the state of health estimation curve being corrected (k−1) times of the battery pack by the correction factor "a", wherein
an expression for calculating the correction factor "a" is the following:

$$a = SOHC_{k\text{-}Average} \div SOHC_{k-1}$$

wherein "k" is an integer larger than zero.

12. The apparatus of claim 8, wherein the processor is further operable for:
if a battery unit in the battery pack does not have any correction opportunity or has only one correction opportunity during the predetermined period of time for estimating the state of health of the battery pack, then estimating the state of health $SOHC_{Estimated}$ of the battery pack based on an initial state of health estimation curve and a corrected initial state of health estimation curve, wherein $$SOHC_{Estimated} = SOHC_{p\ (m-1)} - SOHC\ \text{attenuation value},$$

$$SOHC\ \text{attenuation value} = SOHC_{m-1} - SOHC_m,$$

$SOHC_m$ is obtained based on $x_m$ and a function of the state of health estimation curve that is corrected for the last time before a $m^{th}$ predetermined period of time, and $x_m$ is operating condition data from a start time of estimating the state of health of the battery pack to the end of the $m^{th}$ predetermined period of time;
if a battery unit in the battery pack does not have any correction opportunity or has only one correction opportunity during a $(m-1)^{th}$ predetermined period of time,
$SOHC_{m-1}$ is obtained based on $x_{m-1}$ and the function of the state of health estimation curve that is corrected for the last time before the $m^{th}$ predetermined period of time, and $x_{m-1}$ is the operating condition data from the start time of estimating the state of health of the battery pack to the end of the $(m-1)^{th}$ predetermined period of time,
$SOHC_{P(m-1)}$ is obtained based on $SOHC_{P(m-2)}$, $SOHC_{m-1}$ and $SOHC_{m-2}$,
$SOHC_{P(m-2)}$ is obtained during a $(m-2)^{th}$ predetermined period of time,
$SOHC_{m-2}$ is obtained based on $x_{m-2}$ and the function of the state of health estimation curve that is corrected for the last time before the $(m-1)^{th}$ predetermined period of time, and $x_{m-2}$ is the operating condition data from the start time of estimating the state of health of the battery pack to the end of the $(m-2)^{th}$ predetermined period of time, wherein m is an integer larger than 1, and $SOHC_{p(m-2)}$ is 1 when m is 2;
if a battery unit in the battery pack has two or more correction opportunities during the $(m-1)^{th}$ predetermined period of time,
$SOHC_{m-1}$ is obtained based on the first estimated state of health calculated during the $(m-1)^{th}$ predetermined period of time;
$SOHC_{P(m-1)}$ is the state of health of the battery pack obtained based on the first estimated state of health.

13. A non-transitory computer-readable medium storing computer executable instructions, the computer executable instructions when executed by a processor enabling the processor to implement the method for estimating a state of health of a battery pack of claim 1.

* * * * *